US 6,551,919 B2

(12) United States Patent
Venkatesan et al.

(10) Patent No.: US 6,551,919 B2
(45) Date of Patent: Apr. 22, 2003

(54) METHOD FOR FORMING A DUAL INLAID COPPER INTERCONNECT STRUCTURE

(75) Inventors: Suresh Venkatesan, Austin, TX (US); Bradley P. Smith, Gieres (FR); Mohammed Rabiul Islam, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/970,284

(22) Filed: Oct. 3, 2001

(65) Prior Publication Data

US 2002/0039836 A1 Apr. 4, 2002

Related U.S. Application Data

(62) Division of application No. 09/352,134, filed on Jul. 13, 1999, now Pat. No. 6,326,301.

(51) Int. Cl.[7] .......................................... H01L 21/4763
(52) U.S. Cl. ....................... 438/622; 438/637; 438/639
(58) Field of Search ................................. 438/622, 638, 438/618, 634, 687, 770, 689, 694, 700, 702, 703, 737, 740

(56) References Cited

U.S. PATENT DOCUMENTS

| 5,821,168 A | * | 10/1998 | Jain ............................ 216/18 |
| 5,904,565 A | * | 5/1999 | Nguyen et al. ............. 438/622 |
| 5,960,318 A | * | 9/1999 | Peschke et al. ............. 438/637 |
| 6,077,768 A | | 6/2000 | Ong et al. .................. 438/622 |
| 6,100,184 A | | 8/2000 | Zhao et al. ................. 438/638 |
| 6,103,619 A | | 8/2000 | Lai ............................ 438/638 |
| 6,211,063 B1 | * | 4/2001 | Liu et al. .................... 438/618 |

OTHER PUBLICATIONS

N. Nakamura et al., "High Performance Al Dual Damascene Process with Elevated Double Stoppers", Microelectronics Engineering Laboratory, Toshiba Corp., IEEE (1998), pp. 143–145.

* cited by examiner

Primary Examiner—Michael S. Lebentritt
Assistant Examiner—Christian D. Wilson
(74) Attorney, Agent, or Firm—George R. Meyer; Kim-Marie Vo

(57) ABSTRACT

A dual inlaid copper interconnect structure uses a plasma enhanced nitride (PEN) bottom capping layer and a silicon rich silicon oxynitride intermediate etch stop layer. The interfaces (16a, 16b, 20a, and 20b) between these layers (16 and 20) and their adjacent dielectric layers (18 and 22) are positioned in the stack (13) independent of the desired aspect ratio of trench openings of the copper interconnect in order to improve optical properties of the dielectric stack (13). Etch processing is then used to position the layers (16) and (20) at locations within the inlaid structure depth that result in one or more of reduced DC leakage current, improved optical performance, higher frequency of operation, reduced cross talk, increased flexibility of design, or like improvements.

6 Claims, 5 Drawing Sheets

METHOD FOR FORMING A DUAL INLAID COPPER INTERCONNECT STRUCTURE

This is based on and is a divisional of prior U.S. patent application Ser. No. 09/352,134, filed on Jul. 13, 1999 now U.S. Pat. No. 6,326,301, which is hereby incorporated by reference, and priority thereto for common subject matter is hereby claimed.

FIELD OF THE INVENTION

The present invention relates generally to semiconductor manufacturing, and more particularly to, forming a dual inlaid copper interconnect within an integrated circuit (IC).

BACKGROUND OF THE INVENTION

In the integrated circuit (IC) industry, aluminum interconnects are now being replaced with copper-based inlaid interconnect structures. Copper interconnects are fairly new to the semiconductor industry and are very different from the more commonly used aluminum-based systems. Fur this reason, copper interconnects have uncovered new problems not before anticipated or addressed by integrated circuit manufacturing facilities. Specifically, a dual inlaid copper interconnect structure comprises at least two etch stop layers interleaved between at least two thicker silicon dioxide layers for a total of four layers of dielectric where aluminum usually required only one dielectric material made via one deposition step. The stack of at least two dielectric layers and at least two etch stop layers used by copper interconnects is lithographically patterned and etched in multiple photo steps and via multiple etch processes where aluminum interconnects generally need no such processing. Further the copper metallurgy itself usually requires multiple materials (e.g., barrier layers, seed layers, bulk layers, etc.), multiple deposition steps, and/or one or more chemical mechanical polishing (CMP) processes where aluminum processes needs only a single and simple deposition step.

In order to make these more complex copper interconnect structures efficiently and with high yield, engineers must consider many different combinations of complexities not before addressed. Specifically, lithographic and etch processing of dual inlaid copper structures must contend with one or more of: (1) adverse chemical interactions related to copper; (2) more complicated optical issues associated with the dielectric interfaces in the copper dielectric stack (e.g., light reflection, destructive interference, light distortion, etc.); (3) disadvantageous electrical properties associated with dielectric materials and etch stop layers within the copper dielectric stack; (4) complications in etch chemistries and etch processing; and (5) the more complicated mechanical integrity of the inlaid structure. While one of these five factors may have been faced by aluminum on occasion, never has a combination of two or more of these issues been a serious concern for aluminum-based ICs.

In addition to the collective weight of several of the five factors enumerated above, many copper-based designs require that different copper layers over the same integrated circuit have different trench depths and thicknesses. For example, the dual inlaid via height within inlaid structures may be designed to vary from layer to layer on the same IC, and different trench interconnect depths within the dual inlaid structures may also vary between the first metal layer and the Nth metal layer within a single integrated circuit (N being up to or greater than eight in current IC devices).

With respect to the first of the five factors enumerated above, integrated circuit engineers are concerned with adverse chemical interactions that are associated with copper based materials and processing. Copper will adversely react with ambient air and oxidize in a manner that could reduce integrated circuit yield and/or adversely increase the resistance of the electrical interconnects. In addition, all etch stops and/or capping layers in contact with the copper must be adequate diffusion barriers to prevent copper and associated impurities within the copper from diffusing through the film and contaminating adjacent dielectric layers or underlying electrical devices.

In addition to chemical reactions, engineers who are designing copper-based interconnects should also be concerned with the optical properties of the dielectric stack used to define a dual inlaid or inlaid structure. Chemically mechanically polished (CMP) copper has a highly reflective top surface which may re readily reflect light/energy during lithographic operations. Furthermore, the plurality of dielectric layers in the dielectric stack of a copper interconnect creates many interfaces of different materials that can adversely reflect light and cause distortion of critical dimensions (CDs) and/or destructive interference whereby photoresist is not properly exposed and developed. In other words, at certain depths of lithographic focus, wavelengths of light, and thicknesses of material, light reflected from a surface of a copper interconnect or dielectric interfaces may destructively interfere or distort various lithographic feature sizes resulting in reduced yield and/or reduced performance of an integrated circuit. Therefore, various etch stop and capping layers within an inlaid copper structure should be geometrically and chemically designed with adequate anti-reflective coating (ARC) properties so that a high yield integrated circuit can be manufactured in an effective manner.

Specifically, the thicknesses of the dielectric and etch stop layers within the dielectric inlaid stack must be carefully engineered to reduce reflectance and/or ensure that any reflectance that occurs is primarily destructive interference when some level of reflection is unavoidable. In addition, the index of refraction (N) and the extinction coefficient (K) of the materials within the dielectric stack need to be carefully considered in order to tune the optical properties of the stack to the wavelength of lithographic light utilized. In addition, the interface between different materials within the dielectric stack must be carefully placed to avoid the various optical problems associated with unwanted reflection.

In addition to the chemical interaction concerns and optical concerns discussed above, various electrical properties of films within the dielectric stack must also be considered. Since the etch stop layers, ARC layers, and/or capping layers of the dielectric stack generally contact the interconnect metallurgy, the etch stop/ARC layers need to be materially engineered and physically placed within the dielectric stack to prevent unacceptable levels of leakage current between adjacent interconnects within an integrated circuit. In addition, the dielectric constants of these materials and/or the physical placement and cross sectional geometry of these materials need to be carefully engineered and considered in order to ensure that the IC may be operated at a high frequency of operation absent of significant cross talk and/or parasitic capacitance. In addition, the above engineering should strive to solve these problems while not to complicating the etch chemistries or the etch steps of the dielectric stack in a manner that is unacceptable.

The various layers contained within a dielectric stack of a dual inlaid copper interconnect create various mechanical concerns as well. The materials used in the dielectric stack must be engineered to provide adequate adhesion between silicon dioxide, copper, and various copper barrier materials.

In addition, the stress exerted by these various films on the integrated circuit structure should be at or below an acceptable threshold. Further, the geometric aspect ratio of the via openings and the trench interconnect openings of the dual inlaid structure need to adjusted in order to ensure reduced keyhole formation, reduced voiding, and improved copper electromigration (EM) resistance.

A problem is that any one of the above concerns may be addressed and optimized within an IC interconnect structure when ignoring all the other concerns. When two or three, not to mention all five, of the above discussed concerns are considered at once, it is difficult to make the proper trade-offs and decisions that result in the best possible inlaid structure for a certain set of conditions.

Therefore, it should be evident to one of ordinary skill in the art that many complicated and sometimes conflicting concerns must be considered and balanced when engineering a multi-layer dielectric stack for use in copper interconnected devices. A structure that considers two or more of these needs and creates an improved inlaid structure is needed in the art.

Figure 1:
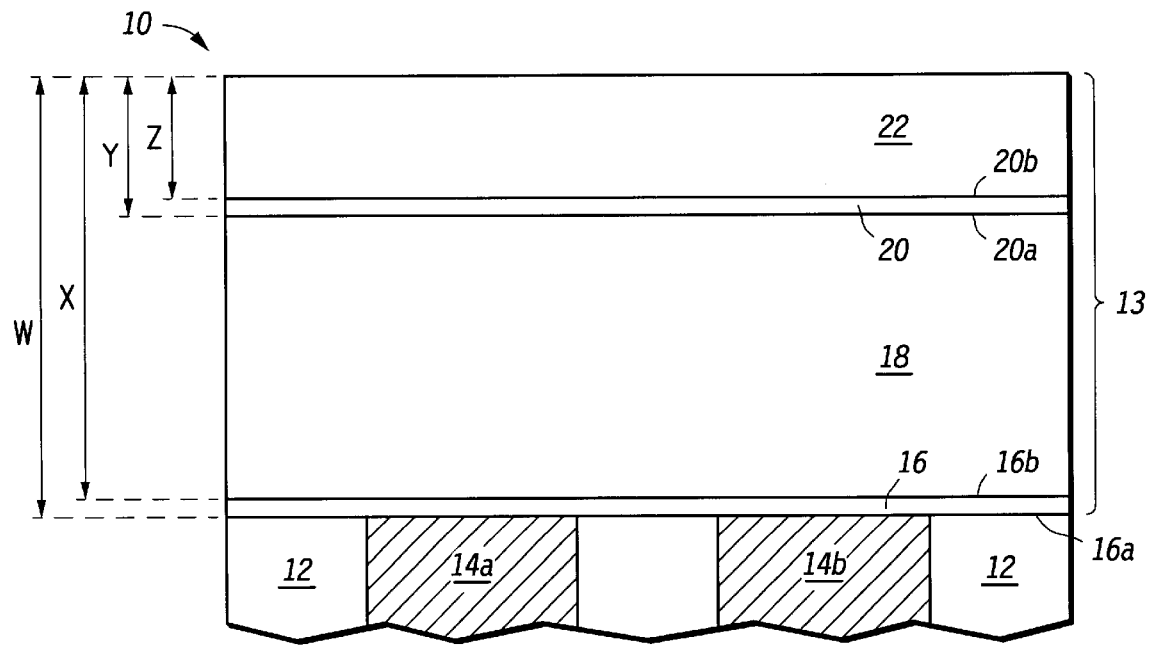
FIGS. 1–5 illustrate, in cross sectional diagrams, a first method for forming a copper interconnect structure.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally each of the two embodiments taught in FIGS. 1–9 herein teach a copper dual inlaid interconnect process and structure that is formed through a dielectric stack. The dielectric stack is specifically engineered based upon the results of significant experimentation and testing. The materials used for the etch stop/ARC layers and dielectric layers within the dielectric stack, as well as their physical placement within this structure and geometry, were designed to optimize or make acceptable trade-offs between two or more of: (1) optimal chemical protection of copper interconnects; (2) improved optical properties within the dielectric stack; (3) improved electrical properties of the structure; (4) reduced etch processing complexity; and (5) improved mechanical integrity of the copper interconnect. In addition, the interconnect structure processing taught herein is flexible for different environments (different materials, different lithographic wavelengths etc.). Further, the processing taught herein allows integrated circuits (ICs) to be manufactured with multiple layers of metal interconnects wherein each layer of metal may have different trench interconnect opening aspect ratios and different via connection opening aspect ratios.

The materials primarily considered for use as etch stop layers and ARCs herein were chemical vapor deposited (CVD) silicon nitride ($SiN_x$), plasma enhanced silicon nitride (PEN), silicon oxynitride ($SiO_xN_y$), and silicon rich silicon oxynitride nitride (Si—$SiO_xN_y$). It was found that CVD silicon nitride films resulted in very good line-to-line current leakage performance, but that CVD silicon nitride must be deposited at a temperature that is too high for use with copper. Also, fear of copper cross-contamination generally prevents manufacturing facilities from putting wafers with copper already on them into a CVD furnace. In addition, the higher dielectric constant of most silicon nitride films (e.g., $\epsilon_r$=7.0–8.0) when compared to silicon oxide (roughly $\epsilon_r$=4.0) resulted in unacceptable high frequency performance of copper interconnects as well as unacceptable cross-talk in some test structures. Therefore, while CVD silicon nitride may be used as an etch stop or ARC layer within any portion of the dielectric stack taught herein, it was generally determined that a better set of trade-offs could be obtained by avoiding any use of conventional CVD silicon nitride films within the inlaid dielectric stacks taught herein.

In addition to CVD silicon nitride, stoichiometric silicon oxynitride (SiON) was also studied in various positions and geometries within the dielectric stack. Stoichiometric silicon oxynitride with an index of refraction of n=1.6 and an extension coefficient of k=0.0 showed very low line-to-line leakage as did CVD silicon nitride. However, stoichiometric SiON also acted as a poor anti-reflective coating (ARC) and a poor via etch stop layer within dielectric stacks. Therefore, while stoichiometric silicon oxynitride may be used in the embodiments taught herein, it was generally found that other materials would likely produce a more acceptable dielectric stack for copper dual inlaid use.

In addition to CVD silicon nitride and stoichiometric SiON, silicon-rich SiON films were researched as capping layers and as etch stop layers in a copper dual inlaid dielectric stack. Many compositions of silicon-rich SiON films were found to be excellent anti-reflective coatings (ARCs) and/or excellent etch stop layers within the dielectric stack, however, their use as a copper capping layer was not practical. SiON was less attractive as a copper capping layer since this material had a greater likelihood of chemically reacting with the copper at the Cu—SiON interface. This reaction produced interfacial films which were shown to occasionally increase leakage current between adjacent copper interconnects and increase sheet resistance within individual interconnects. Therefore, when considering several of the five areas of concern enumerated above when searching for an improved etch stop, capping, and ARC layer combination, it was found that a silicon-rich silicon oxynitride films were best put to use as an intermediate etch stop layer near a central portion of the inlaid dielectric stack. However, Si-rich SiON material can be engineered to be generally used in any etch stop, ARC layer, or capping function within the devices taught herein, sometimes to less, but potentially acceptable, effect.

The final of the four layers researched for use in the dielectric stack was plasma enhanced silicon nitride (PEN). It was found that plasma enhanced silicon nitride was an optimal capping layer to place in direct contact with copper since experimental results indicated either no degradation in sheet resistance or an acceptable interconnect resistance. In addition, PEN resulted in a reduction in leakage current while the containment and protection of the copper over time was within accepted tolerances.

In addition to determining the optimal material composition of various etch stop layers, ARC layers, and capping layers within the dielectric stack, the embodiments taught herein specifically engineer the various thicknesses, geometric properties, and physical positions of layers within the inlaid dielectric stack in order to improve or maintain the optical integrity of the interconnect structure during manufacturing. Therefore, the selection of materials discussed above has typically improved the chemical stability of the copper interconnect, improved the electrical properties of the interconnect structures, and provided adequate mechanical stability to the integrated circuit while at the same time being engineered to provide adequate or improved optical properties over and above that available in prior art inlaid structures. In addition to obtaining these benefits, the etch processing taught herein is not significantly complicated compared to conventional copper processing. In addition, the resulting cross-sectional geometries (i.e., aspect ratio) of the trench interconnect opening in the via interconnect opening are also optimized in the structures herein to allow for formation of copper interconnects with reduced voiding and keyholes so that integrated circuit (IC) yield is enhanced.

Specific details of the various embodiments may be understood with specific references FIGS. 1–9.

Specifically, FIGS. 1–5 illustrate a first embodiment that may be used to form a dual inlaid copper interconnect structure within an integrated circuit (IC).

FIG. 1 illustrates a few beginning process steps that are used to start the formation of an integrated circuit 10. Integrated circuit 10 is to contain one or more layers of inlaid copper interconnect structures. In FIG. 1, all the shown elements are formed over a substrate surface, printed circuit board (PCB) or like substrate. While not specifically illustrated in FIG. 1, the substrate material which is commonly used for integrated circuit formation is one of silicon, silicon germanium, germanium, gallium arsenide, other III-V compounds, a silicon carbide, epitaxial regions, silicon on insulator (SOI) substrates, or like starting material. Over this substrate is formed any number of passive devices such as resistors, capacitors, inductors, diodes, and the like. In addition, the substrate may support up to millions of integrated active devices, such as NMOS transistors, PMOS transistors, bipolar transistors, JFETs, thyristors, SCRs, memory cells, logic gates, and/or like electrical circuitry. Furthermore, micromachined and/or electromechanical devices such as pressure transducers, gears, engines, detectors, and/or the like may be formed on the integrated circuit (IC) substrate.

The various devices that are formed on top of the substrate may be interconnected by one or more metallic layers. A single metallic layer may be used to form many segmented interconnects across the integrated circuit (IC). FIG. 1 specifically illustrates that a first metallic layer is used to form at least two such interconnects 14a and 14b. FIG. 1 illustrates that a dielectric layer 12 is generally used to electrically isolate one interconnect 14a from another interconnect 14b within one metallic layer. Any one interconnect layer of an integrated circuit may contain millions of individuals and segmented interconnects similar to 14a and 14b, and an integrated circuit may contain up to 8 or more stacked layers of interconnect metallurgy over the top of one another. In FIG. 1, interconnects such as 14a and 14b are generally formed as one of either tungsten (W) plugs, tungsten local interconnects, aluminum wiring, inlaid copper interconnects, polysllicon regions, dual inlaid copper interconnects, composite metallic contacts, and/or like integrated circuit conductive members. In addition, various dielectric layers taught herein, such as dielectric layer 12, are usually one or more of tetraethelorthosilicate (TEOS), fluorine doped TEOS (f-TEOS), low k dielectrics, borophosphosilicate glass (BPSG), phosphosilicate glass (PSG), spin on glasses (SOG), silicon nitride layers, metal oxides, air gaps, composites thereof, and/or like dielectric regions.

FIG. 1 illustrates that a dielectric stack 13 is formed over a top of the interconnects 14a and 14b and a top of the dielectric layer 12. Generally, a dielectric stack is any vertically stacked combination of two or more different dielectric materials. Specifically, FIG. 1 illustrates a dielectric stack 13 that contains four layers 16, 18, 20, and 22. The layers 16, 18, 20, and 22 are subsequently used to form dual inlaid copper interconnect structures across an IC.

As previously discussed, the capping layer 16 must be physically positioned, geometrically designed, and composed of a material that provides certain acceptable properties and/or functions. Generally, the layer 16 should be an acceptable protective layer for the interconnects 14a and 14b, especially if these layers may be adversely affected by exposure to an environment. For example, if layers 14a and 14b are a copper-based interconnects, layer 16 should provide adequate containment and protection of copper to prevent or reduce copper oxidation or contamination. Furthermore, layer 16 should function as an adequate barrier layer that prevents any copper contaminants or like contaminants from diffusing from regions 14a and 14b into adjacent dielectric layers such as layers 12 and 18. The thickness and position of the layer 16 as well as its index of refraction (N) and its extinction coefficient (K) should serve to improve the optical integrity of the dielectric stack 13 (i.e., reduce distortion, reduce destructive interference, etc.). Proper engineering of this layer will result in reduced destructive interference upon light reflection, diminish any intensity of reflected light, and reduced distortion of lithographic critical dimensions (CD's) upon reflection. In addition, layer 16 should be chosen to provide acceptable levels of leakage current between the layers 14a and 14b while providing for high frequency performance having reduced cross talk between layers 14a and 14b.

As previously discussed, it has been determined that a plasma enhanced silicon nitride (PEN) layer is an optimal layer for use as layer 16 in FIG. 1 in order to reasonably obtain the above objectives. While it was found that plasma enhanced nitride (PEN) is a most appropriate choice for the material used for layer 16, other materials such as silicon oxynitride, silicon rich silicon nitride, silicon rich silicon oxynitride, CVD silicon nitride, or composites of these materials with or without PEN may be used as the capping layer 16 in FIG. 1. It was found that a thickness of the layer 16 of roughly 500 angstroms worked well when using lithographic exposures of roughly 365 nm (i.e., I-line). However, other thicknesses may be used for I line, and other thicknesses are used for different wavelengths of exposure in order to optimally change the dimensions X and W in the figures do different lithographic characteristics. Other thicknesses may be easily derived for other commonly used lithographic wavelengths, such as 248 nm (deep UV). In essence, the thickness of this film as well as its placement within the stack is also largely a function of the wavelength used for lithographic operations as is the engineered index of refraction and extension coefficient of this film. In addition, the reflective properties of the interface 16b and 16a is also largely a function of the composition and physical dimensions of the layers 18 and 12. Therefore, while an optimal layer 16 is roughly a 500 angstrom PEN layer when using I-line in the environment discussed herein, other reasonable thicknesses and other materials may be used for layer 16 under different circumstances.

A dielectric layer 18 is formed within the dielectric stack 13 overlying the capping layer 16. In a preferred form, for improved electrical properties, adequate mechanical properties, and adequate optical properties, the layer 18 was selected as a CVD TEOS layer. However, the layer 18 may be any other dielectric layer taught herein or may be any composite thereof. Generally, the thickness of the layer (X-Y) is selected to be roughly 8000 angstroms in thickness. This thickness is selected to improve the optical properties of the structure when using lithographic wavelengths of 365 nanometers (I-line) for photoresist processing over the dielectric stack 13. It should be understood that different thicknesses will result when different lithographic wavelengths are used, different material compositions are selected, different thicknesses of material are deposited, different interfaces are created, different chemical compositions are formed, and/or the like.

After formation of the layer 18, an etch stop layer 20 is deposited over the layer 18 and the dielectric stack 13. Generally, the layer 20 is chosen as any layer that can be an etch stop for the overlying layer 22. In addition, it is advantageous if the layer 20 prevents copper leakage. Further, the thickness and material composition of layer 20 should be engineered to improve the optical properties of the overall structure 13. Since the layer 20 will generally be adjacent or in close proximity to the trench interconnect regions and since these trench interconnect regions are more closely spaced to each other via dimension C (see FIG. 5), the layer 20 of FIG. 1 needs to be electrically robust enough to ensure low levels of leakage current. Further, an improved device is formed if the layer 20 has a dielectric constant and capacitive geometry that is conducive to higher frequencies of operation without adversely high parasitic capacitors and/or excessive cross talk.

A material that was found to provide a good trade off and balance among the above considerations was silicon-rich silicon oxynitride (Si—SiON). A silicon rich silicon oxynitride film provides an excellent antireflective coating (ARC) for improved optical properties and was also found to be an excellent etch stop layer for the overlying layer 22. In addition, the minimal surface area contacted the layer 20 to any subsequent metallurgy ensured that any reactions that could occur therebetween were of little impact to the overall performance of the device. It was found that the SiON layer 20 and the barrier materials of the copper interconnect, if they reacted with each other, did not result in unacceptable degradation in sheet resistance or unacceptable increase in line-to-line leakage current.

Generally, a thickness of the silicon-rich SiON layer 20 (Y-Z) is on the order of 600 angstroms for I-line lithographic processing. It is important to note that different thicknesses of layer 20 may be used and that different materials or composites of materials other than silicon-rich silicon oxynitride may be used for layer 20. For example, a thicker layer of stoichiometric silicon oxynitride may replace the silicon rich silicon oxynitride layer 20, but such a layer would likely need to be at least 1000 angstroms in thickness whereby etch throughput, leakage, etc. may be altered. Other composite materials and/or different thicknesses may be optimal in other circumstances where different materials are used for layers 18 and 22, different lithographic wavelengths are used, or different conditions apply. However, for the materials discussed so far and for I-line lithography of 365 nanometers, the 600 Angstroms silicon rich SiON layer is optimal with the above discussed layers 18 and 20.

After formation of layer 20, a top layer 22 is formed as a top portion of the dielectric stack 13. Layer 22 is generally analogous to the layer 18 in term of material composition. However, the layer 22 is generally deposited to a thickness that is less than the layer 18. As shown in FIG. 1, various surfaces 16a, 16b, 20a and 20b must be adequately positioned within the trench and subject to properly engineered indices of refraction in extinction coefficient values in order to improve the optical characteristics of the overall interconnect structure. For this purpose, the layer 22 is generally a CVD TEOS layer that is roughly 4000–5000 angstroms in thickness.

In summary of FIG. 1, an acceptable dielectric stack was found to be:

TABLE 1

| Wavelength of Lithography | Layer ID and Material | Thickness of Layer (range and target) | Useful Process Information | Refractive Index (N) | Extinction Coefficient (K) |
|---|---|---|---|---|---|
| I-line 365 nm | bottom etch stop 16 (PEN layer) | 300–800 Angstroms, 500 Angstrom target | use a parallel plate RF reactor by Applied Materials, flow both SiH4 and NH4 at 370° C. to 410° C. | 1.5–3.0 with roughly 2.3 being a target | 0.0 to 0.4 with 0.027 being a target |
|  | bottom dielectric layer 18 (TEOS layer) | 6,000–10,000 Angstroms, 8,000 Angstrom target |  |  |  |
|  | top etch stop layer 20 (Si rich SiON) | 300–800 Angstroms, 600 Angstrom target | use a parallel plate RF reactor by Applied Materials, flow all of SiH4, N2O and NH4, at 370° C. to 410° C. | 2.0–4 0 with one of either 2.8 or 3.5 being a target | 0.1 to 1.0 with one of either 0.3 or 0.7 being a target |
|  | top dielectric layer (TEOS layer) | 3,000–6,000 Angstroms, 4,500 Angstrom target |  |  |  |
| Deep UV 248 nm | bottom etch stop 16 (PEN layer) | 300–600 Angstroms, 500 Angstrom target | use a parallel plate RF reactor by Applied Materials, flow both SiH4 and NH4 at 370° C. to 410° C. | 1.0–3.0 with roughly 2.1 being a target | 0.0 to 0.4 with 0.0 being a target |

TABLE 1-continued

| Wavelength of Lithography | Layer ID and Material | Thickness of Layer (range and target) | Useful Process Information | Refractive Index (N) | Extinction Coefficient (K) |
|---|---|---|---|---|---|
| | bottom dielectric layer 18 (TEOS layer) | 6,000–10,000 Angstroms, 8,000 Angstrom target | | | |
| | top etch stop layer 20 (Si rich SiON) | 300–800 Angstroms, 600 Angstrom target | use a parallel plate RF reactor by Applied Materials, flow all of SiH4, N2O, and NH4, at 370° C. to 410° C. | 2.0–4.0 with 2.5 being a target | 0.1 to 1.5 with 0.9 being a target |
| | top dielectric layer (TEOS layer) | 3,000–6,000 Angstroms, 4,500 Angstrom target | | | |

In addition, stoichiometric SiON may be used in place of the silicon-rich SiON if formed to thicknesses above 1000 Angstroms with an N value of roughly 1.6 and a K value of roughly 0.0 at I-line (365 nm) lithographic exposure. Stoichiometric SiON when exposed with Deep UV was similar except that N was roughly 1.7 and K was roughly 0.03.

Figure 2:
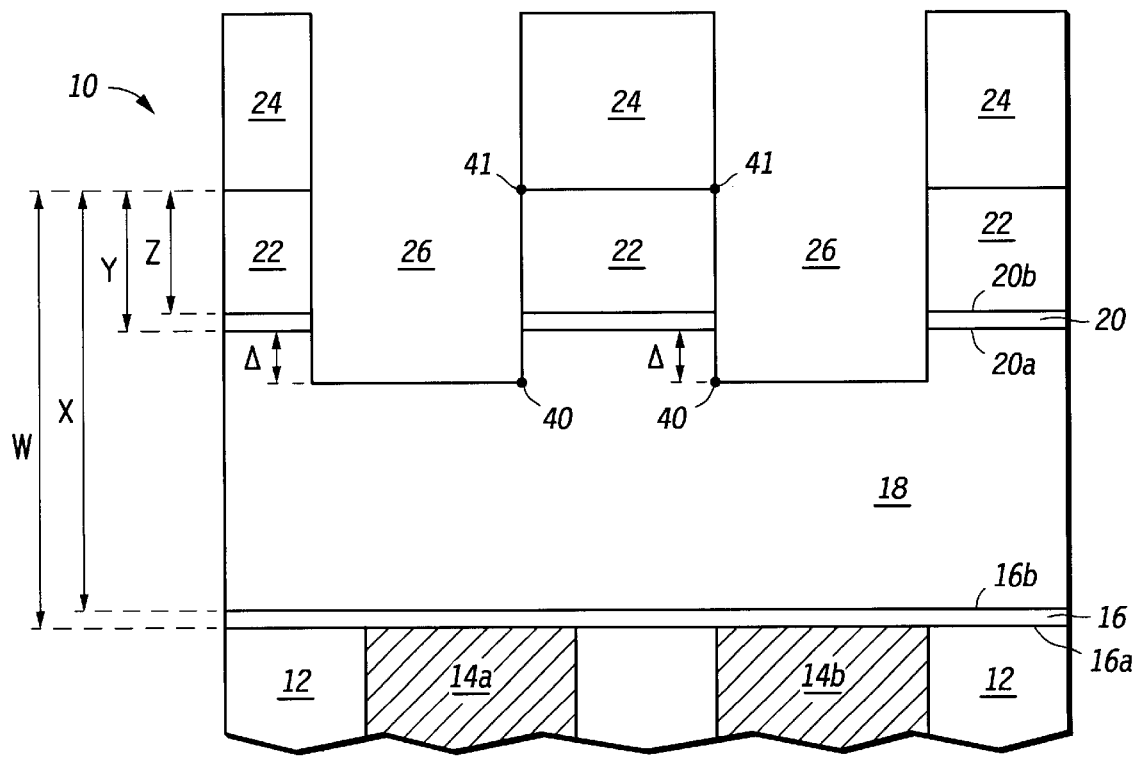

FIG. 2 illustrates that a photoresist layer 24 is spin coated or deposited over a top of the layer 22. A lithography mask is then placed between a light source or energy source and the photoresist 24. Energy or light is then passed selectively through the mask or altered by the mask to selectively expose portions of the photoresist 24. Generally, this exposure is I-line exposure at 365 nanometers. However, other lithographic processes such as deep UV at 248 nanometers, phase shift lithography, x-ray, SCALPEL, or other lithographic wavelengths or processing may be used.

As previously stated, changes in the lithography process may require changes in the thicknesses, materials, placement, or processing of the dielectric stack 13 to further optimize the stack 13 to these environmental alterations. It is important to note that the lithographic wavelength of light that used will generally determine the dimensions W, X, Y, and Z illustrated in FIG. 1. When using I-line lithography at 365 nanometers, a roughly 4000–5000 angstrom thickness of TEOS layer 22, a roughly 600 angstrom thickness of silicon rich SiON layer 20, a roughly 8000 angstrom thickness of TEOS layer 18, and a roughly 500 angstrom thickness of the plasma enhanced nitride (PEN) layer 16 creates interfaces 16A, 16B, 20A, and 20B at depths W, X, Y, and Z that prevent or substantially reduce adverse destructive interference and/or distortion when performing the lithographic step illustrated in FIG. 2 (see Table 1 above).

After the portions of the photoresist 24 are lithographically exposed as taught herein, a chemical development process is used to remove certain portions of the photoresist 24 selective to other portions of the photoresist. After photoresist development, the wafer is placed within a reactive ion etch (RIE) chamber or like plasma etch system whereby an oxide etch is used to remove portions of the layer 22 that are exposed by the openings in the photoresist layer 24. This oxide etch is generally performed selective to the silicon rich silicon oxynitride (Si—SiON) layer 20. Optical endpoint detection or like endpoint techniques may be used to determine when a substantial portion of the layer 20 has been exposed through the dielectric layer 22. At this point, the etch chemistry is altered to a second etch chemistry which removes exposed portions of the SiON layer 20 within the openings in the photoresist 24.

It is important to note that the layer 20 is positioned at a relatively shallow height Y within the dielectric stack 13 to result in improved optical properties within the dielectric stack 13 during lithographic operations. However, adequate trench interconnect cross-sectional area is needed to produce acceptably low line resistance and to create desired aspect ratios for subsequent CVD, electroplating, electroless, or like copper fill operations. Proper aspect ratios are preferred since certain aspect ratios are better than others at reduce voiding and key hole formation during copper fill operations. In order to provide for this optimal geometry or aspect ratio of the trench region 26, the trench region 26 is extended by an additional oxide etch a distance $\Delta$ into the layer 18 as illustrated in FIG. 2. Generally, $\Delta$ is a few hundred Angstroms to a few thousand Angstroms with about 1,000 Angstroms being typical. Generally, etch stop layers are used to ensure uniformity and repeatability within a dielectric stack etching process. Therefore, trenching beyond the depth of an etch stop layer via an additional timed etch is unusual in the art. However, due to current advances in conventional timed etch processing, the standard deviation from wafer-to-wafer and the standard deviation across a surface of a single wafer when performing the $\Delta$ etch of layer 18 in FIG. 2 is very acceptable. This over-etch is so well controlled using modern oxide etch procedures that the dimension $\Delta$ can be controlled to within a distribution of few tens or hundreds of angstroms for all openings 26 wafer-to-wafer and across the same wafer. Therefore, even though an additional trenching operation into layer 18 is performed, repeatable and consistent dimensions of a trench interconnect opening 26 are very possible since the dimension $\Delta$ is only a fraction of the total depth of the trench interconnect region 26. After formation of the trench interconnect openings 26, the photoresist 24 is removed by an ashing process.

The positioning of the SiON layer 20 at a shallow depth the stack 13 and compensating for such shallow placement by a $\Delta$ etch is advantageous for two reasons. First, this shallow positioning of the layer 20 improves the optical properties of the dielectric stack 13. An additional benefit from this shallow placement of the layer 20 along with the $\Delta$ etch is that the SiON layer 20 is physically placed along a side wall of the trench region 26 so that layer 20 is physically removed vertically from the trench interconnect corners 40 and 41 as illustrated in FIG. 2. When placing a high dielectric constant material (e.g., silicon nitride with $\epsilon r \approx 8$) at these corners 40 and/or 41, the electrical performance of copper inlaid interconnects is degraded by greater direct current (DC) leakage and reduced high frequency performance. Therefore, the shallow positioning of layer 20 in the dielectric stack 13 for the purpose of optical improvements may have the side effect of also improving the electrical properties of the interconnect structure.

Figure 3:
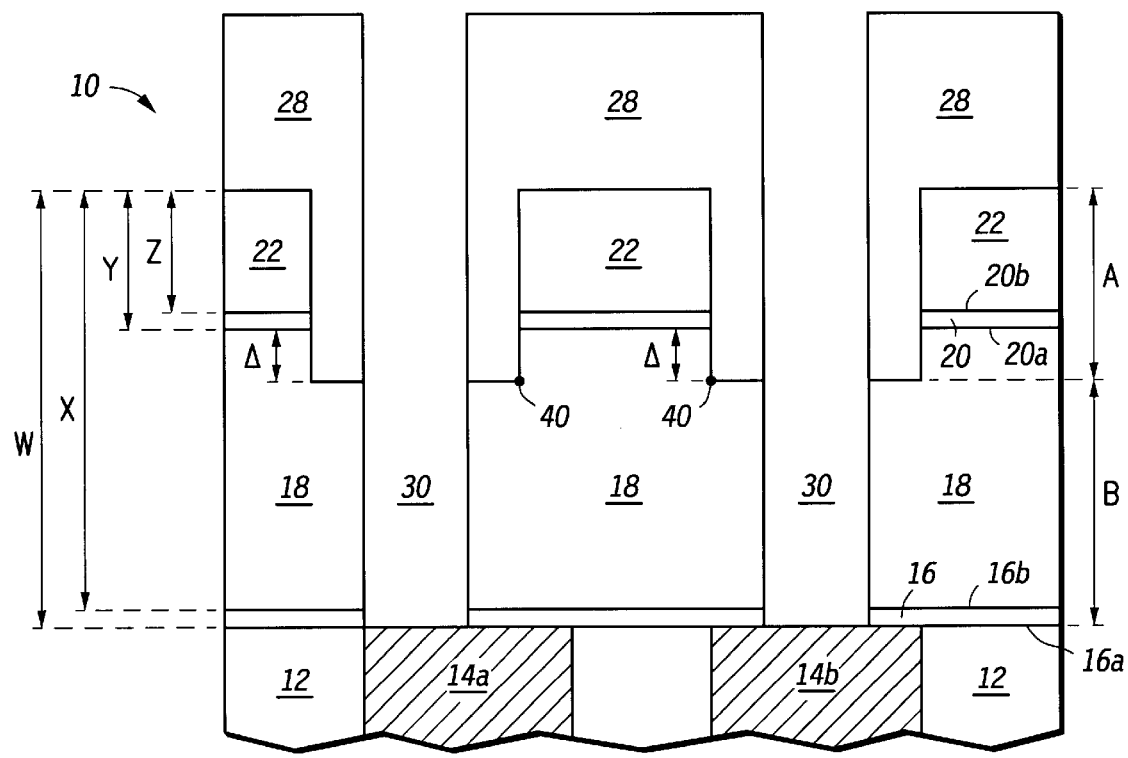

FIG. 3 illustrates that a second photoresist layer 28 is deposited over a surface of the wafer after the openings 26 are formed via FIG. 2. A second masking, lithographic, and chemical development process is used in FIG. 3 to form via openings within the photoresist 28 as illustrated in FIG. 3. These via openings in the photoresist 28 expose a via portion of the layer 18 within the trench interconnect 26. These via portions are etched by an oxide reactive ion etch (RIE) or a like plasma process until portions of the plasma enhanced nitride (PEN) layer 16 is exposed. At this point, via a timed etch or some form of etch endpointing, the etch chemistry and/or process parameters are switched to a plasma enhanced nitride etch which removes exposed portions of the layer 16 within the vias 30. In another embodiment, a timed etch may be performed whereby no stopping on the nitride layer occurs. The resulting via openings 30 expose some portion of the regions 14a and 14b to enable electrical contact of the regions 14a and 14b to overlying metallurgy that is formed in later processing steps.

Due to the additional Δ trenching performed during the interconnect trench etch illustrated in FIG. 2, the depth of via opening 30 (shown as dimension B in FIGS. 3–5) is less than what the via depth would have been had the via opening started at the bottom of the etch stop layer 20. Therefore, the aspect ratio of the via opening 30 may also be adjusted by adjusting the Δ trenching. Proper Δ trenching has been found to provide an aspect ratio of the via 30 that is more easily and completely filled with copper interconnect material without unwanted voiding and/or keyhole formation. This has also been shown to improve the electromigration (EM) resistance of the various copper interconnects formed herein. Generally, for I-line lithographic processing of 365 nanometers, a trench interconnect depth A equal to 6000 angstroms and a via depth B of approximately 7000 angstroms is typical (see dimensions A and B in FIGS. 3–5).

Figure 4:
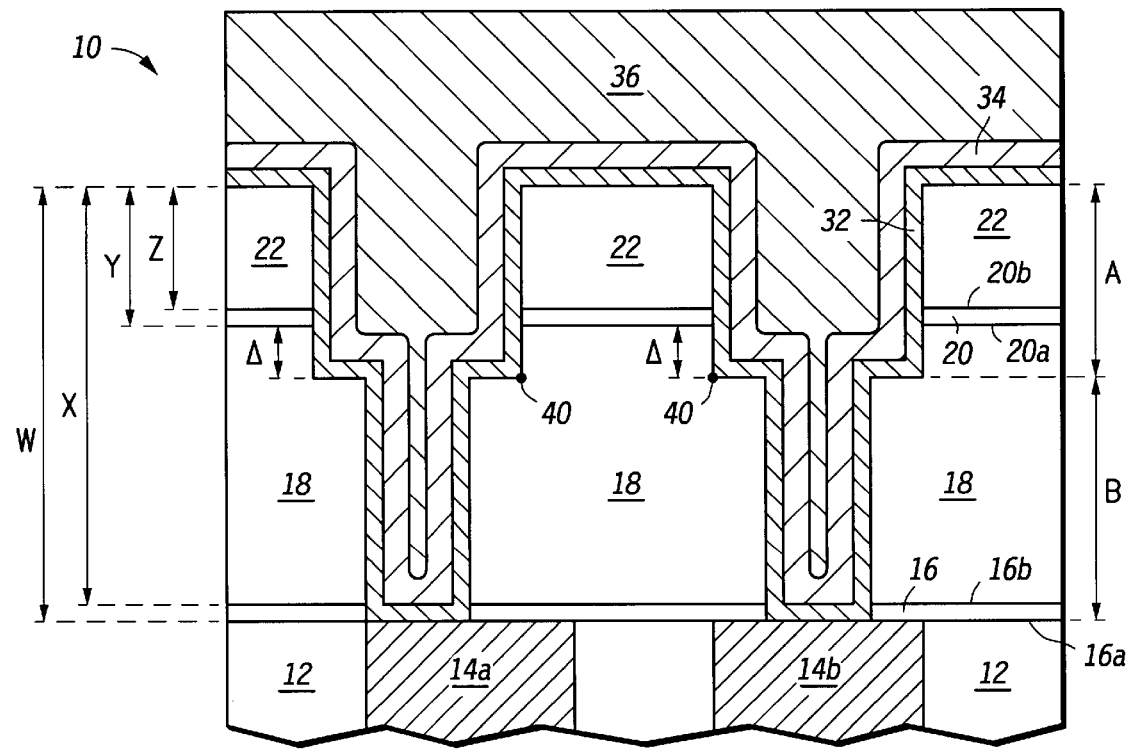

FIG. 4 illustrates that the photoresist 28 is ashed off of or removed from the surface of the device 10 after formation of the via portions 30. FIG. 4 then illustrates that some deposition and/or sputtering process is used to form a barrier layer 32 within the interconnect structures illustrated in FIG. 3. Typical copper barrier materials include tantalum, titanium nitride, tantalum nitride, titanium tungsten, tungsten nitride, tungsten, composites thereof, or like barrier materials. Typical thicknesses of barrier layers range from 200 Angstroms to 1,000 Angstroms with 600 Angstroms being typical.

After formation of the barrier layer 32, FIG. 4 illustrates that a CVD copper seed layer 34 is deposited over the barrier 32. The seed layer 34 is then used to electroplate or electroless plate a bulk copper layer 36 over a top of the layer 34. In another form, a single CVD process or a multi-step CVD methodology may be used to form the bulk layer 36 and the layer 34 without electroless plating or electroplating. The copper layer may also include various conductive capping layers that are similar to the layer 32, and the copper-based interconnect layers 32 and 24 may be a pure copper layer or a copper alloy comprising 10% or more of copper by volume.

Figure 5:
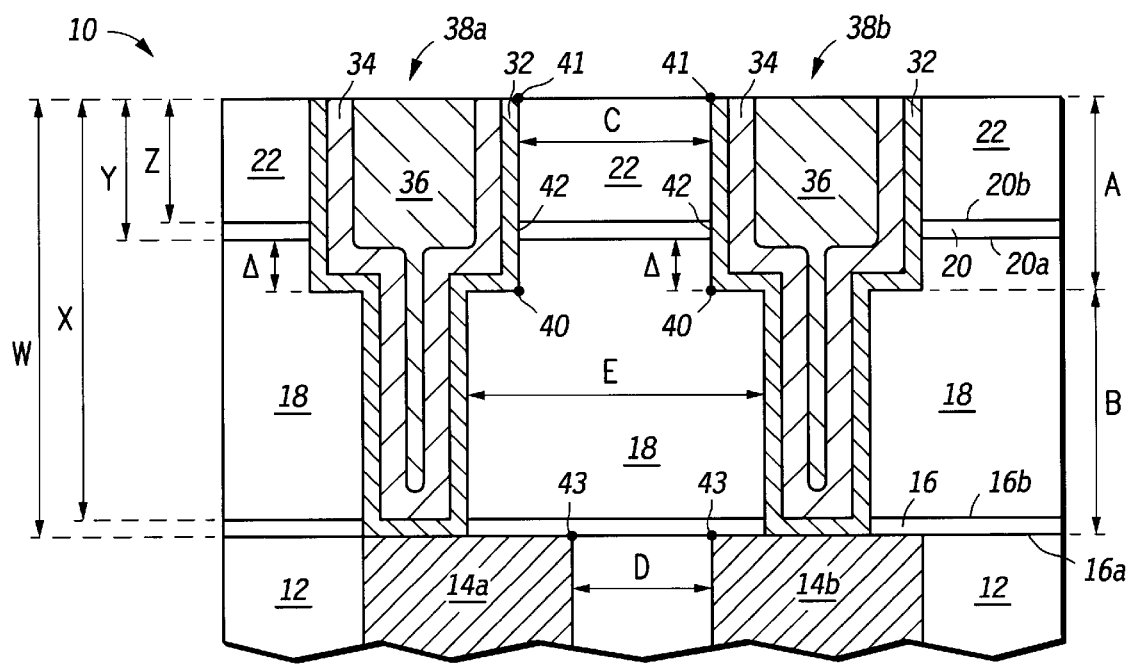

FIG. 5 illustrates that a chemical mechanical polishing (CMP) process is used to polish top portions of the layers 32, 34, and 36 from a surface of the structure 10. Completion of the polishing operation will result in the formation of a first dual inlaid interconnect 38a and a second dual inlaid interconnect 38B via a single layer of metallurgy as shown in FIG. 5. Generally, a single layer of metallurgy will form thousands or even millions of interconnects similar to that shown in FIG. 5.

The structure illustrated in FIG. 5 has been optimized over the prior art in one of several ways. By choosing a plasma enhanced silicon nitride (PEN) layer as the layer 16 an improved capping layer of layers 14a and 14b has been created. Decent capping layers are needed especially if the underlying metal regions 14a and 14b are copper-based interconnects. Such capping layers will prevent diffusion of copper and other associated copper impurities into adjacent oxides and underlying electrical devices.

In addition, by choosing silicon rich silicon oxynitride (Si—SiON) as the layer 20 of FIG. 5, an improved intermediate etch stop layer has been formed over that found in the prior art. It was found that the SiON layer is easily formed with a dielectric constant of $\epsilon r \leq 7.0$ with $\epsilon r \approx 6.5$ being likely. This has been shown to reduce line-to-line leakage as well as improve high frequency operation of the IC 10. By choosing these materials for layers 16 and 20, as well as some form of TEOS for-layers 18 and 22, and by choosing appropriate depths W, X, Y, and Z independent of the desired aspect ratio of the trench region 26 and the via portion 30, the optical properties of the dielectric stack 13 are optimized or at least improved for any desired lithography. Furthermore, the positioning of the layer 20 away from trench interconnect opening corners 40 and 41 has improved high frequency performance where regions 38a and 38b may either be moved closer together to reduce die size or driven to higher operation frequencies (e.g., the GigaHertz range). In addition, the use of the additional oxide etch that results in the offset Δ is used to correct the aspect ratio of the trenches 26 and 30 in FIGS. 2 and 3 respectfully so that metallurgical fill of these dual inlaid regions is improved. Furthermore, by simply changing the Δ etch from wafer-to-wafer or from layer-to-layer on the same wafer, many different via depths and trench depths may be accommodated within an integrated circuit while optical performance is not degraded. This flexibility is also an advantage since different metallic interconnect layers on the same device 10 may have different aspect ratios as is required by different designs (e.g., different designs rules, process flows, device functionality, lithographic processing, etc., may require changes in the aspect ratios).

FIGS. 6–9 illustrate an alternate embodiment that may further improve upon the DC leakage current and high frequency operation of the embodiment discussed with respect with FIGS. 1–5. Such improvement can be better understood with reference to the dimensions C and D in FIG. 5. From FIG. 5, it is clear that the dimension D between regions 14a and 14b is small. In some cases, dimension D may be on the order of less than 1–2 microns. In addition, the presence of the layer 16 at the top corners 43 of the regions 14a and 14b ensures that leakage between regions 14a and 14b through the layer 16 is probably non-optimal. In addition, the cross-sectional area of vias is considerably smaller than that of trenches. Therefore, if a process can be developed that results in the layer 20 being positioned on the sidewalls between the via openings along the dimension E as opposed to between sidewalls of trench interconnect regions 26 along the dimension C, leakage current and high frequency performance of an integrated circuit 10 may be enhanced. Further, such leakage current performance and high frequency operation may be further improved by additionally removing a high leakage layer 16 from contact with the points 43 of FIG. 5 and placing a lower leakage layer 15 in contact with the points 43. However, the layer 15 still needs to be a decent barrier for copper to prevent copper diffusion if the regions 14a and 14b are copper-based interconnects.

FIGS. 6–9 illustrate a process which obtains these results at the expense of the tradeoff of complicating the via opening etch process.

Figure 6:
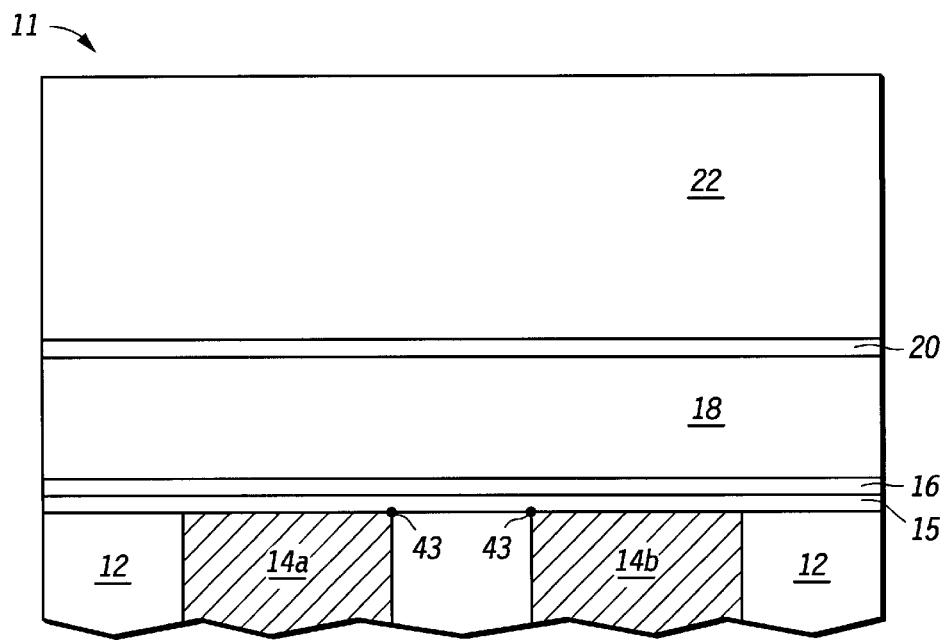
FIGS. 6–9 illustrate, in cross sectional diagram, a second method that is used for forming dual inlaid copper interconnects on an integrated circuit (IC).

FIG. 6 illustrates a structure 11 very similar to the structure 10 illustrated in FIG. 1. Elements in regions in FIG. 6 that are analogous to elements in regions in FIG. 1 are identified by identical alphanumerical labels. These redundant layers are not discussed with respect to FIG. 6 due to the fact that they are extremely similar or identical to their analogous layers set forth with respect to FIG. 1. One difference between FIG. 6 and FIG. 1 is the presence of an optional pad dielectric layer 15. Generally, the layer 15 is any material that is a barrier to copper and provides reduced DC leakage and improved high frequency operation. For example, layer 15 may be a very thin stoichiometric SiON layer that is formed as discussed herein. In other forms, one of the layers 16 or 15 may be a nitride layer, a oxynitride layer, an undoped silicon layer, an organic dielectric, a silicon rich nitride or oxynitride, etc., while the other layer is a different material selected from that same group. The purpose of the layer 15 is to offset a more current leaky layer 16 from the corners 43 of the regions 14a and 14b. In other forms, the etch stop layer 16 may be placed in direct contact with the regions 14a and 14b as in FIG. 1 whereby the layer 15 is not used. With layer 15, the leakage current and high frequency operation between the regions 14a and 14b may be improved.

Figure 7:
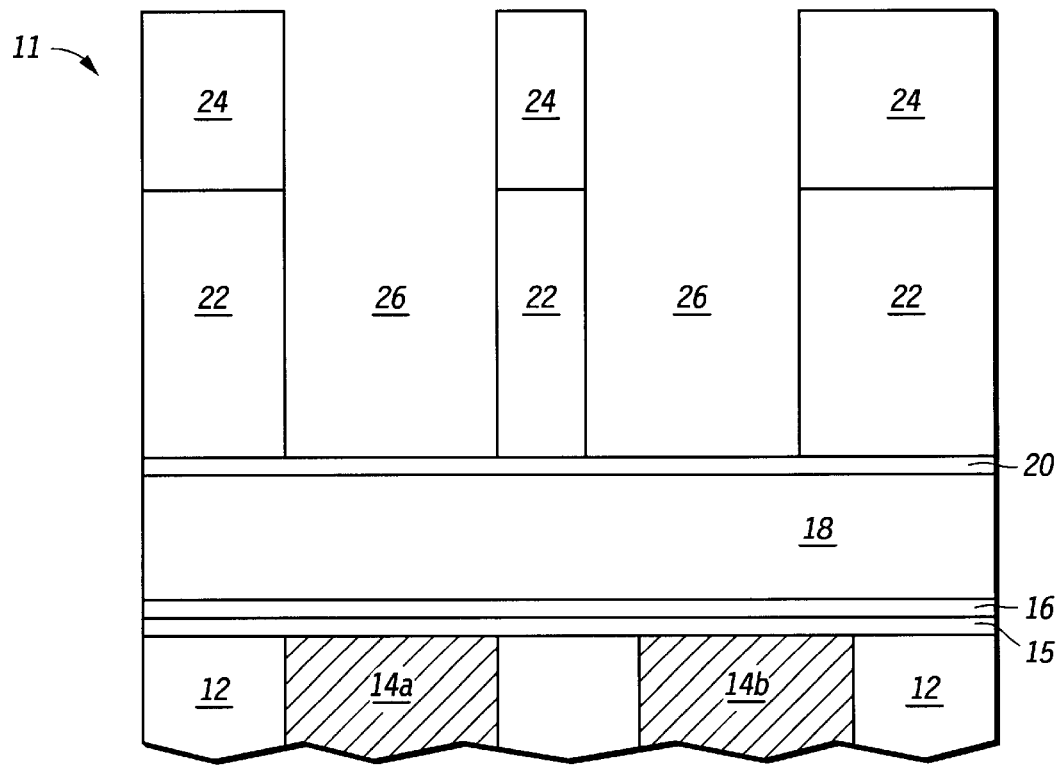

FIG. 7 illustrates that a photoresist layer 24 or like photosensitive layer is used to etch an opening in the layer 22. Instead of trenching through the region 22 as shown in FIG. 2 and instead of trenching by a dimension Δ into the layer 18, such etch operations are not performed in FIG. 7. Instead, once a timed etch or optical or chemical endpoint process results in exposure of the layer 20, the photoresist layer 24 is ashed from a surface of the device 11.

Figure 8:
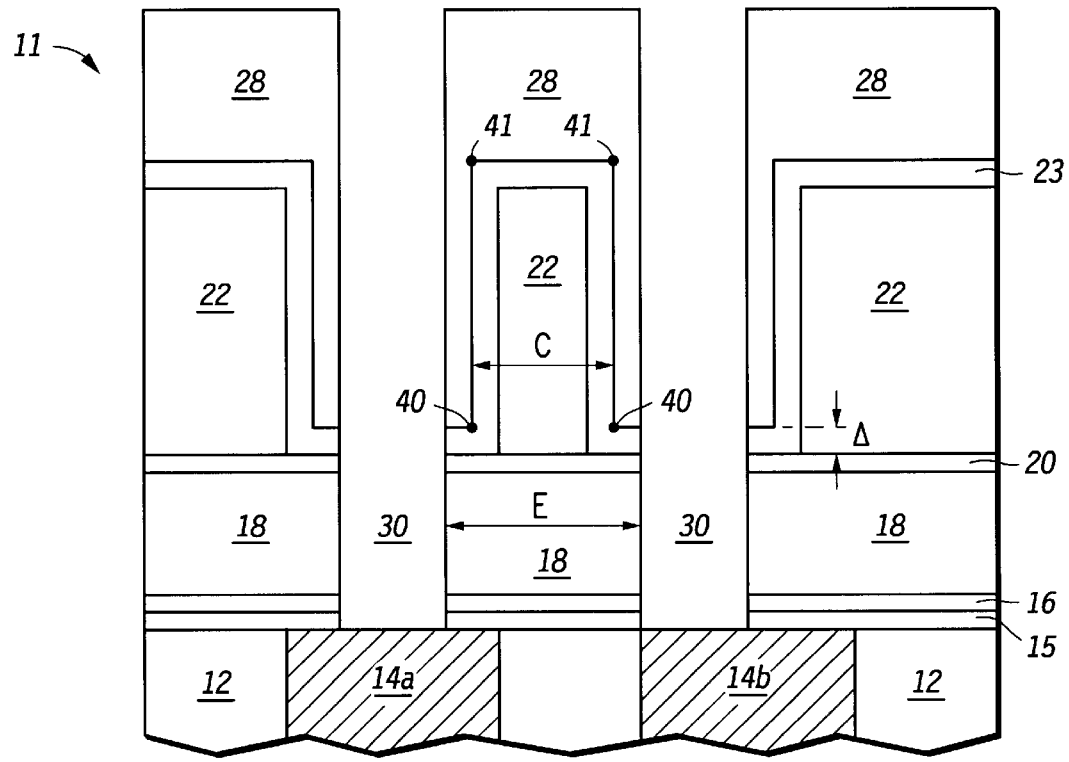

FIG. 8 illustrates that a dielectric layer 23 is deposited over a contour of the etched layer 22 illustrated in FIG. 7. Generally, the layer 23 is deposited as a fluorine doped TEOS layer, a CVD TEOS layer, an ozone TEOS layer, a low k dielectric, composites thereof, or any other dielectric layer discussed herein. Further, layer 23 may contain some barrier material that is useful for containing copper during subsequent processing. It is important to note that FIG. 8 illustrates that the layer 23 is a conformal layer that is not exposed to an etch process before photoresist material 28 is formed. However, it should be noted, that the material 23 may be reactive ion etched (RIE processed) or plasma etched to form dielectric sidewall spacers along vertical walls of layer 22 before formation or after stripping of the photoresist layer 28. In either event, the step of depositing the layer 23 provides a thickness A of material between the leaky and higher dielectric constant material 20 and the bottom surface/corners 40 of the interconnect trench region 26. Therefore, similar to the embodiment illustrated in FIG. 5, the layer 20 has been removed from the corners 40 and 41 of the dual inlaid structure whereby leakage current and high frequency operation is improved.

In FIG. 8, the photoresist layer 28 is formed. A sequential etch operation involving an oxide etch, followed by a SiON etch, followed by an oxide etch, followed by a PEN etch is used to expose top surfaces of the layers 14a and 14b to a via opening 30.

Figure 9:
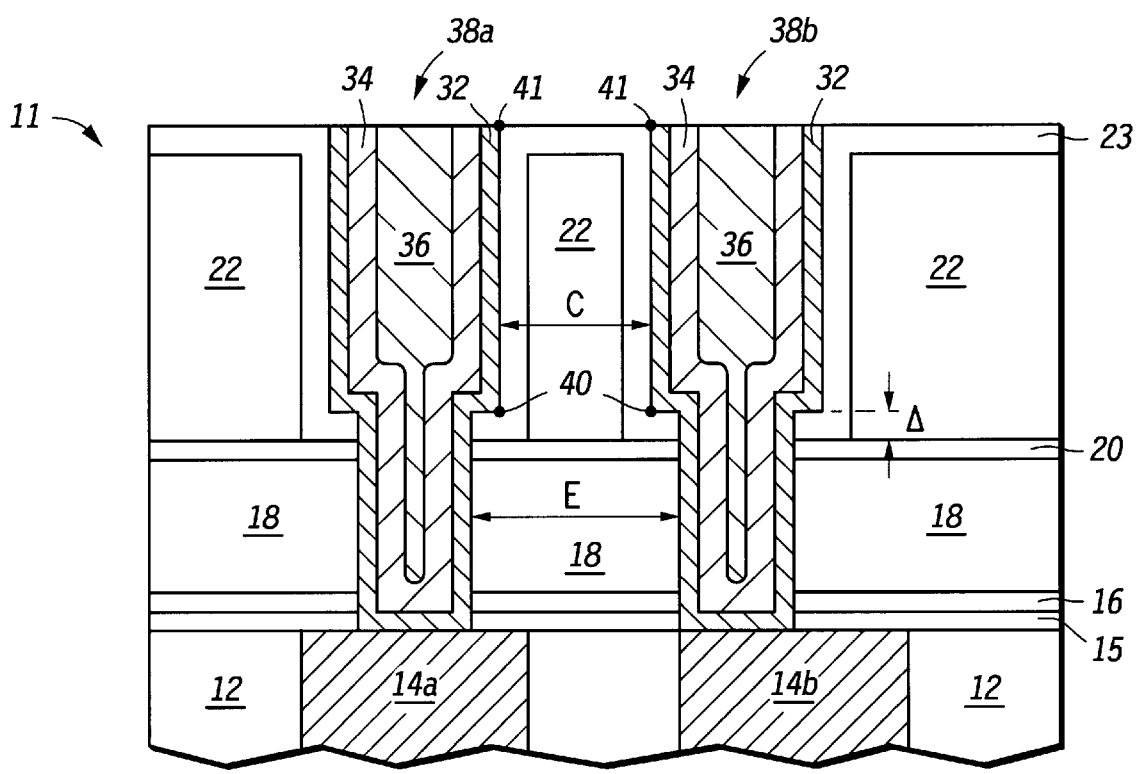

FIG. 9 illustrates that conventional barrier and copper processing along with chemical mechanical polishing (CMP) is then used to form the metallic layers 32 through 36 in a manner similar to that discussed with respect to FIG. 5. FIG. 9 differs from the structure illustrated in FIG. 5 by virtue of the fact that both etch stop, capping, and/or ARC layers 20 and 16 physically reside between interconnects 38a and 38b in FIG. 9 only along the greater dimension E between via openings and not between the regions 38a and 38b along the shorter dimension C. By virtue of contacting the layer 20 along the dimension E in FIG. 9 as opposed to the dimension C in FIG. 5, leakage currents may be reduced and high frequency operation may be enhanced. This improvement is obtained while the layer 23 may be used to simultaneously provide additional isolation between interconnect trench regions and while aspect regions of the trench interconnect openings and via openings are still maintained within prudent ranges. One drawback of the process of FIG. 6 through FIG. 9 is that the four-step via etch procedure discussed with respect to FIG. 8 is more complicated than the via etch processing discussed in FIG. 3. However, in some embodiments, the complexity of the etch of FIG. 8 is worth the tradeoff of the possibility of improved high frequency operation and reduced DC leakage current. Therefore, either the process of FIGS. 1–5, the process of FIGS. 6–9, or some combination/hybrid of these two processes may be used to form one or more inlaid or dual inlaid copper interconnect structures for an integrated circuit 10 or 11.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, the embodiments taught herein teach a trench-first via-last dual inlaid formation process. it is possible to perform a via-first trench-last dual inlaid structure in the embodiments taught herein and the teachings herein should be so construed. Therefore, it is intended that this invention encompass all of the variations and modifications as fall within the scope of the appended claims.

What is claimed is:

1. A method for forming an interconnect, the method comprising the steps of:

forming a first etch stop layer;

forming a first dielectric layer over the first etch stop layer;

forming a second etch stop layer;

forming a second dielectric layer over the second etch stop layer;

etching a first opening entirely through a portion of the second dielectric layer;

depositing a third dielectric layer within the first opening;

etching the third dielectric layer to form a sidewall spacer within the first opening;

etching a second opening through the first etch stop layer and the first dielectric layer wherein the second opening is contiguous with the first opening; and filling both the first opening and second opening with a metal interconnect.

2. The method of claim 1 wherein the metal interconnect comprises a copper-based material and a copper barrier layer.

3. The method of claim 1 wherein the first etch stop layer is a plasma enhanced nitride (PEN) layer and the second etch stop layer is a silicon rich silicon oxynitride layer.

4. The method of claim 1, wherein the second dielectric layer is a low-k dielectric.

5. The method of claim 4, wherein the third dielectric layer is silicon nitride.

6. The method of claim 1, wherein the first opening is an interconnect trench and the second opening is a via portion.

* * * * *